(12) United States Patent
Menkhoff

(10) Patent No.: US 8,537,944 B2
(45) Date of Patent: Sep. 17, 2013

(54) APPARATUS WITH A PLURALITY OF FILTERS

(75) Inventor: Andreas Menkhoff, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 854 days.

(21) Appl. No.: 11/937,606

(22) Filed: Nov. 9, 2007

(65) Prior Publication Data

US 2009/0122930 A1    May 14, 2009

(51) Int. Cl.
*H04B 1/10* (2006.01)
(52) U.S. Cl.
USPC .......................................... 375/350; 455/296
(58) Field of Classification Search
USPC ........................................ 375/350; 455/296
See application file for complete search history.

(56) References Cited

U.S. PATENT DOCUMENTS

| | | | |
|---|---|---|---|
| 6,463,450 B1 * | 10/2002 | Balachandran et al. | 708/300 |
| 6,798,288 B1 * | 9/2004 | Jayaraman et al. | 330/207 A |
| 7,136,114 B2 * | 11/2006 | Zahm et al. | 348/731 |
| 7,142,884 B2 | 11/2006 | Hagn | |
| 2006/0176948 A1 * | 8/2006 | Lee | 375/233 |
| 2008/0304405 A1 * | 12/2008 | Lindoff et al. | 370/210 |

FOREIGN PATENT DOCUMENTS

| | | |
|---|---|---|
| DE | 4038903 | 6/1992 |
| DE | 19934744 | 2/2001 |
| DE | 10053205 | 5/2002 |

* cited by examiner

*Primary Examiner* — Kenneth Lam
*Assistant Examiner* — Michael Neff
(74) *Attorney, Agent, or Firm* — Banner & Witcoff, Ltd.

(57) ABSTRACT

An apparatus comprises a filter unit comprising a plurality of different filters each configured to filter a first signal when selected. The apparatus may further comprise a control unit configured to select one of the plurality of filters depending on a strength of the first signal. Related methods may also be performed.

25 Claims, 7 Drawing Sheets

APPARATUS WITH A PLURALITY OF FILTERS

BACKGROUND

Radio transmitters use filters to select a frequency range within which information modulated on a radio signal is to be transmitted. To avoid interference with transmit signals of other radio devices, mobile radio standards typically define spectral transmission masks which specify upper thresholds for the signal strength within predetermined frequency ranges. Accordingly, filters in radio transmitters may be configured to output filtered signals that comply with a given spectral transmission mask.

Mobile radio standards, for example UMTS (Universal Mobile Communications System), require mobile radio devices to transmit signals with varying strength depending on the distance of the mobile radio device to a base station. The transmit filter is supposed to have a quality such that even for signals emitted with the maximum signal strength, the spectral transmission mask is observed.

Similarly, mobile radio devices receive signals of varying strength from base stations depending on the transmission characteristics of the immediate environment and the distance of the mobile radio device to a base station. A receive filter is used in the mobile radio device to filter the receive signal within a certain frequency range and to suppress interference signals outside that frequency range (i.e. co-channel interference). The receive filter should have a quality such that even for low signal strength of the receive signal intended for the mobile radio device and/or for high co-channel interference, the filtered signal may still be decoded in the receiver.

SUMMARY

Various aspects are described. For example, illustrative embodiments of an apparatus are described that comprise a filter unit comprising a plurality of different filters each configured to filter a first signal when selected. The apparatus may further comprise a control unit configured to select one of the plurality of filters depending on a strength of the first signal. Related methods may also be performed.

These and other aspects will be described herein.

BRIEF DESCRIPTION OF THE DRAWINGS

Various illustrative embodiments are explained in detail below with reference to the drawings, in which.

DETAILED DESCRIPTION

Figure 1:
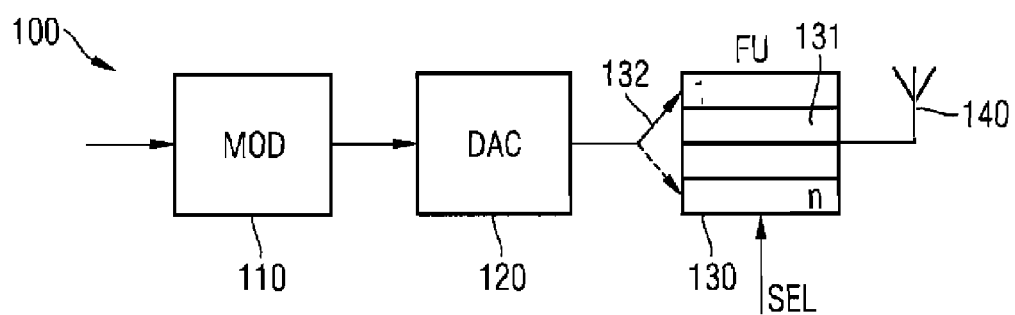
FIG. 1 is a schematic of an illustrative embodiment of a radio transmitter 100.

In the following, examples of embodiments are described with reference to the drawings, wherein like reference numerals are generally utilized to refer to like elements throughout. In the following description, for purposes of explanation, numerous specific details are set forth by way of example to provide a thorough understanding of one or more aspects of embodiments. However, the following description is not to be taken in a limiting sense.

Filters as discussed below may be characterized in terms of filter quality. A filter of a high quality is characterized by a high suppression rate of signal strength at frequencies which lie outside a frequency range for which the filter is specified, while still maintaining a high transmission rate for frequencies which lie within a frequency range for which the filter is specified. The quality of a filter may be dependent on the order of the filter which is given by integers. A high-order filter may generally indicate a high quality of the filter, whereas a low-order filter may generally indicate a low quality of the filter.

Filters as discussed below may be digital filters and/or analog filters. A digital filters may be characterized by the length of its filter path. Digital filters with longer filter paths may generally be of a higher quality than digital filters with shorter filter paths. Filters may, if not explicitly noted otherwise, include known filter types such as polyphase filters, Farrow filters, infinite impulse response (FIR) filters, finite impulse response (FIR) filters, interpolators, and other filter types.

Besides the depicted and described components, transmitters and receivers as depicted and described herein may include additional components commonly used in transmitters and receivers, in particular mobile radio transmitters and mobile radio receivers. For reasons of clarity, schematic illustrations of additional components commonly used in transmitters and receivers have been omitted in the FIGS. 1 to 8.

FIG. 1 shows a schematic of an illustrative embodiment of a radio transmitter 100. A digital transmit signal is modulated by a modulator 110 and converted to an analog transmit signal by a digital-to-analog converter 120. The analog transmit signal is then fed to an analog filter unit 130, which includes a plurality of analog filters 131, labeled with numbers from 1 to n. A filter selector signal SEL is generated to control a filter selector 132. The filter selector 132 may be a multiplexer or other switching means to feed the analog transmit signal to one of the plurality of analog filters 131 of the analog filter unit 130 upon the filter selector signal SEL. After filtering, the analog transmit signal is transmitted via a radio antenna 140.

The analog filters 131 included in the analog filter unit 130 may be configured as physically separate filters, wherein each analog filter 131 is provided with one or more separate dedicated filter components. The analog filters 131 may alternatively or additionally be configured to share one or more common filter components. The number of analog filters 131 included in the analog filter unit 130 is not limited to a specific number n. The filter selector signal SEL may be, for example, a bit sequence such as a word signal. The filter selector signal SEL may be derived from an external source or may be generated within the radio transmitter 100 upon a measurement, a signal from an external source, or a predetermined code sequence stored within data storage (e.g., memory) of the radio transmitter 100.

The radio transmitter 100 may be driven in burst mode or in continuous mode. If the radio transmitter 100 is driven in burst mode, the filter selector signal SEL may be configured in such a way that a change of filter selection occurs between two subsequent signal bursts. If the radio transmitter 100 is driven in continuous mode, the filter selector signal SEL may be configured in such a way that a change of filter selection occurs during the filtering of the continuously transmitted signal. The radio transmitter 100 may further have one or more delay units configured to delay the transmit signal by predetermined periods of time depending on the change of the filter selection of the analog filter unit 130.

Figure 2:
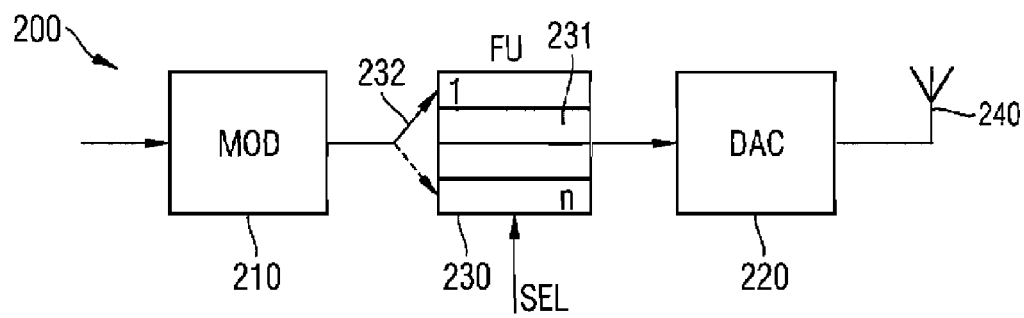
FIG. 2 is a schematic of another illustrative embodiment of a radio transmitter 200.

FIG. 2 is a schematic of another illustrative embodiment of a radio transmitter 200. A digital transmit signal is modulated by a modulator 210. The digital transmit signal is then fed to a digital filter unit 230, which includes a plurality of digital filters 231, which are labeled with numbers from 1 to n. A filter selector signal SEL is generated to control a filter selector 232. The filter selector 232 may be a multiplexer or similar switching means to feed the digital transmit signal to one of the plurality of digital filters 231 of the digital filter unit 230 upon the filter selector signal SEL. After filtering the digital transmit signal is converted to an analog transmit signal by a digital-to-analog converter 220 and then transmitted via a radio antenna 240.

The digital filters 231 included in the digital filter unit 230 may be configured as physically separate filters, wherein each digital filter 231 is provided with one or more separate dedicated filter components. The digital filters 231 may alternatively or additionally be configured to share one or more common filter components. The number of digital filters 231 included in the digital filter unit 230 is not limited to a specific number n. The filter selector signal SEL may be configured in a similar to the filter selector signal SEL of FIG. 1.

The radio transmitter 200 may be driven in burst mode or in continuous mode, in a similar manner as the radio transmitter 100 in FIG. 1.

The basic structure of a radio receiver is essentially the reverse of the structure of a transmitter. Thus, with minor modifications, the transmitter structures 100 and 200 may also represent receivers. Briefly, in a receiver built similarly to transmitter 100, for example, an analog receive signal is received via an antenna 140, filtered with a filter unit 131, converted to a digital receive signal via an analog-to-digital converter unit (which is implemented instead of the digital-to-analog converter unit 120) and demodulated with a demodulator unit (which is implemented instead of the modulator 110). In this case, the selector 132 is arranged between the antenna 140 and the analog filter unit 131. And, in a receiver built similarly to transmitter 200, an analog receive signal is received via an antenna 140, converted to a digital receive signal via an analog-to-digital converter unit (which is implemented instead of the digital-to-analog converter unit 220), filtered with a filter unit 231 and demodulated with a demodulator unit (which is implemented instead of the modulator 210). In this case, the selector 232 is arranged between the analog-to-digital converter unit and the digital filter unit 231. Upconversion units in transmitters and downconversion units in receivers are not depicted in FIGS. 1 and 2, but it is understood that such units may be used with these receivers and transmitters.

Figure 3:
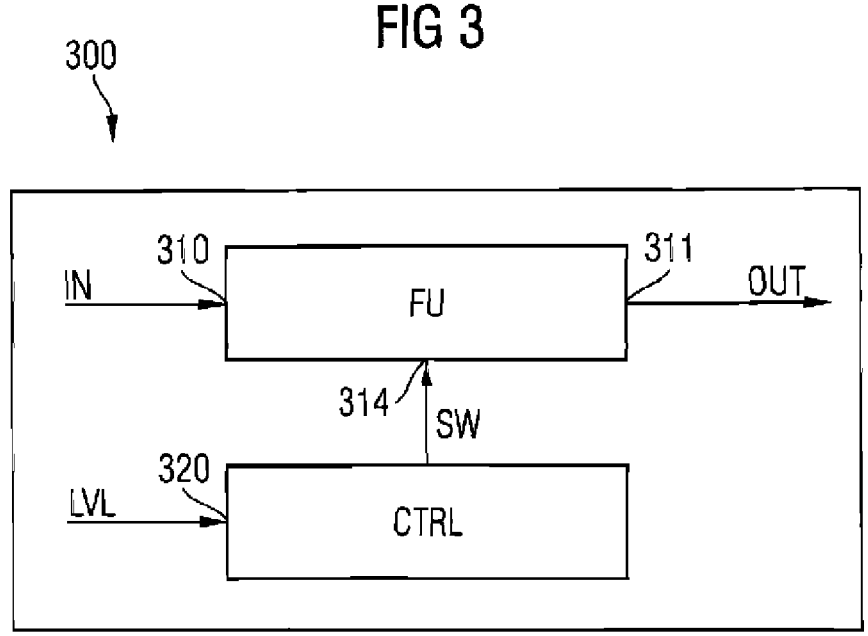
FIG. 3 is a schematic of an illustrative embodiment of a section 300 of a radio transmitter having an adaptive transmit filter.

FIG. 3 is a schematic of an illustrative embodiment of a section 300 of a radio transmitter having an adjustable transmit filter. The radio transmitter section 300 has a filter unit FU which may correspond to the filter units 131 or 231 shown in FIGS. 1 and 2, respectively. The filter unit FU has a first input 310, a second input 314 and an output 311 and a control unit CTRL with an input 320. A radio signal IN is fed to the first input 310 of the filter unit FU, filtered by the filter unit FU and output at the output 311 as a filtered radio signal OUT. The filtered radio signal OUT may be a transmit signal. The control unit CTRL is fed at the input 320 with a level signal LVL, which is indicative of the strength of the transmit signal or the strength of the radio signal IN. Depending on the level signal LVL the control unit CTRL generates a control signal SW which is fed to the second input 314 of the filter unit FU.

The filter unit FU includes a plurality of different filters which are configured to filter the radio signal IN. The plurality of filters included in the filter unit FU may be configured as physically separate filters, wherein each filter of the plurality of filters is provided with separate filter components. The plurality of filters may also be configured to use one or more common filter components.

The level signal LVL may be generated by an external source outside the radio transmitter 300. For instance, the level signal LVL may be generated by a radio base station. The level signal LVL may be indicative of the required strength a transmit radio signal OUT to be transmitted by the radio transmitter 300 should have. For example, the level signal LVL may be generated by a radio base station operating in a mobile radio standard such as UMTS. The level signal LVL may also be a signal indicative of the signal strength of the radio signal IN and/or the filtered radio signal OUT, which is measured with a signal strength measurement unit. In this case, the level signal LVL may be generated by a level signal generator included in the radio transmitter 300. The level signal LVL may also be generated taking into account other circumstances connected with the transmission characteristics of the radio signal OUT like environmental characteristics, transmission strength thresholds, distance to a base station and other variables. The level signal LVL may be generated within a mobile radio device containing the radio transmitter 300 and may be dependent upon predetermined variables stored in the mobile radio device.

The control unit CTRL is configured to generate a control signal SW dependent on the aforementioned level signal LVL. The control signal SW is fed to the filter unit FU and may be a bit sequence or a scale word. The control signal SW may also be a continuous signal or a stepwise discrete signal. The control signal SW is configured to select a filter from the plurality of different filters of the filter unit FU. Upon selection of a filter, the radio signal IN is filtered by the filter selected by the control signal SW.

The radio transmitter 300 may further have one or more delay units configured to delay the filtered radio signal OUT by a predetermined period of time according to the filter selection caused by the control signal SW. If the control signal SW is causing a change of the selected filter during a filtering of a continuous radio signal IN, changes in the group velocity of the filtered radio signal OUT may occur, which may disrupt the smooth and error-free transmission of the filtered transmit radio signal OUT. The delay units may be arranged to compensate for such changes of the group velocity. In other words, the delay units may allow the group velocity within the signal path to be almost constant and independent of the filter selection.

Figure 4:
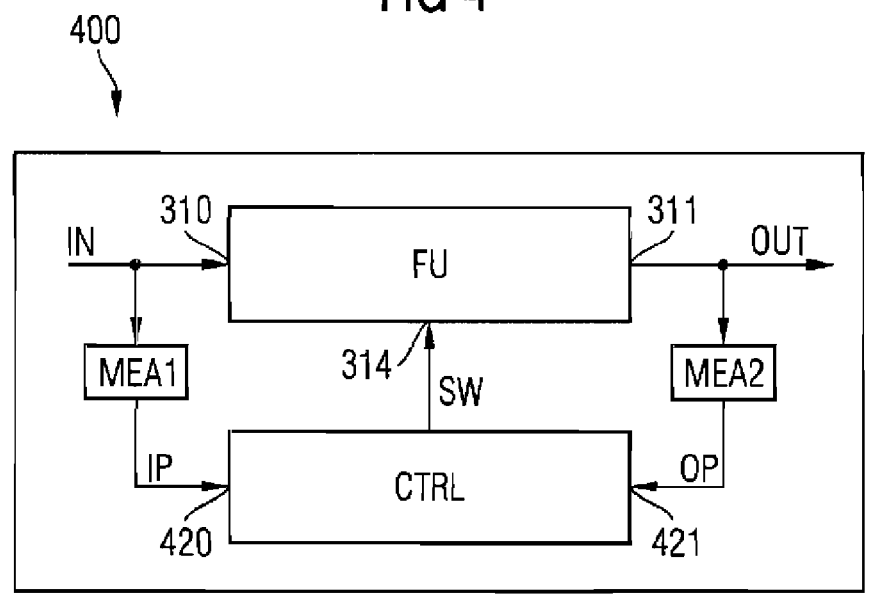
FIG. 4 is a schematic of an illustrative embodiment of a section 400 of a radio receiver having an adaptive receive filter.

FIG. 4 is a schematic of an illustrative embodiment of a section 400 of a radio receiver comprising an adjustable receive filter FU which may correspond to the filter units 131 or 231 shown in FIGS. 1 and 2, respectively, for the case of a receiver. The filter unit FU has a first input 310, a second input 314 and an output 311 and a control unit CTRL with a first input 420 and a second input 421. A radio signal IN is fed to the first input 310 of the filter unit FU, filtered by the filter unit FU and output at the output 311 as a filtered radio signal OUT. The radio signal IN is additionally fed to a first measurement unit MEA1, which measures the strength of the radio signal IN and generates an input power signal IP which is fed to the first input 420 of the control unit CTRL. The radio signal IN may be a receive signal. The filtered radio signal OUT is additionally fed to a second measurement unit MEA2, which measures the strength of the filtered radio signal OUT and generates an output power signal OP which is fed to the second input 421 of the control unit CTRL. Depending on the input power signal IP and/or the output power signal OP, the control unit CTRL generates a control signal SW which is fed to the second input 314 of the filter unit FU.

The filter unit FU may be configured analogously to the filter unit FU in FIG. 3 and the control signal SW may be configured similarly to the control signal SW in FIG. 3.

The first measurement unit MEA1 and the second measurement unit MEA2 each may include a unit for determining the signal strength of an input signal, such as a unit for determining the root mean square of the amplitude of the input signal or a unit for determining the absolute value of the amplitude of the input signal. The first measurement unit MEA1 may generate an input power signal IP which is indicative of the signal strength of the radio signal IN. For instance, the input power signal IP may be indicative of the signal strength at all frequencies contained in the radio signal IN. The second measurement unit MEA2 may generate an output power signal OP which is indicative of the signal strength of the filtered radio signal OUT. For instance, the output power signal OP may be indicative of the signal strength at all frequencies contained in the filtered radio signal OUT.

The control unit CTRL relates or otherwise compares the input power signal IP and the output power signal OP to generate the control signal SW. For instance, the control signal SW may depend on the input power signal IP and the output power signal OP (e.g., depend on a ratio between the input power signal IP and the output power signal OP). If the output power signal OP is small compared to the input power signal IP, this may indicate that the filtering quality of the momentarily selected filter of the filter unit FU is sufficient, because signals at neighboring frequencies to the frequency filtered for in the filter unit FU are suppressed to a sufficient degree, thereby decreasing the overall signal strength of the radio signal after filtering. On the other hand, if the output power signal OP is nearly equal to the input power signal IP, it may indicate that the filtering quality of the momentarily selected filter of the filter unit FU is not sufficient, because signals at neighboring frequencies to the frequency filtered for in the filter unit FU are not suppressed to a sufficient degree. The control unit CTRL may be configured to change the control signal SW when the ratio between the input power signal IP and the output power signal OP reaches a predetermined threshold. In response to reaching the threshold, a different filter that may be more appropriate to the current receiving characteristics may be selected in the filter unit FU. Other evaluation methods for generating an appropriate control signal SW, such as evaluating the difference between the input power signal IP and the output power signal OP, or evaluating either the input power signal IP or the output power signal OP without the other, may be performed by the control unit CTRL as well.

Figure 5:
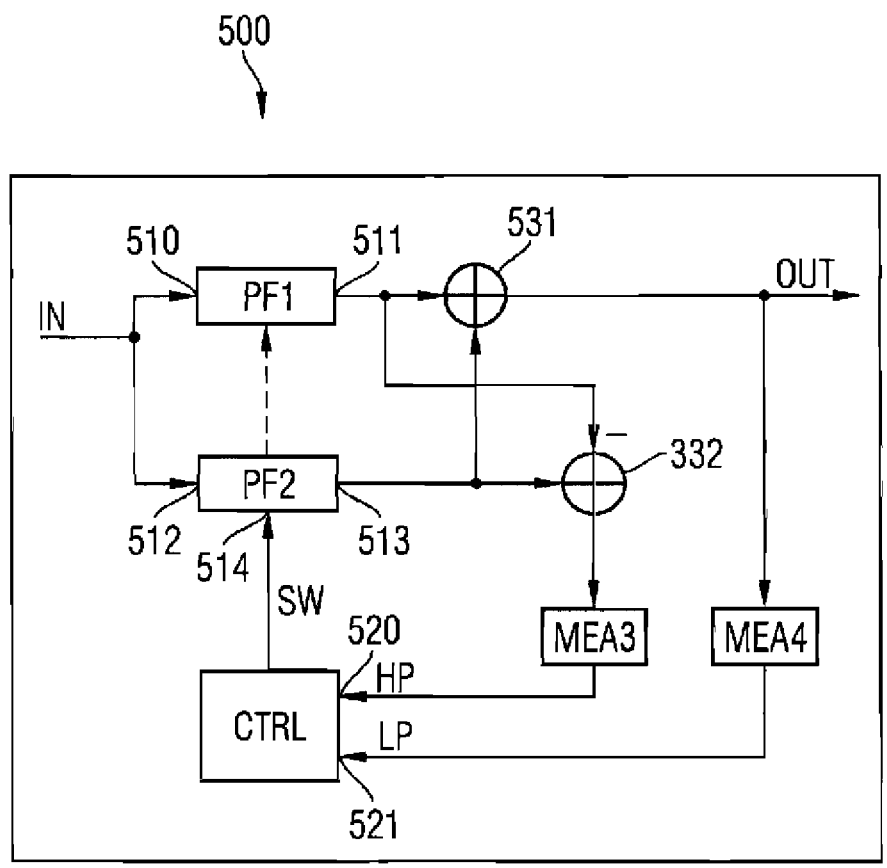
FIG. 5 is a schematic of another illustrative embodiment of a section 500 of a radio receiver having an adaptive receive filter.

FIG. 5 is a schematic of another illustrative embodiment of a section 500 of a radio receiver comprising another adjustable receive filter FU which may correspond to the filter units 131 or 231 shown in FIGS. 1 and 2, respectively, for the case of a receiver. The radio receiver section 500 comprises a first polyphase filter PF1 with a first input 510 and an output 511, a second polyphase filter PF2 with a first input 512 and an output 513, a control unit CTRL with a first input 520 and a second input 521, a first adder 531 arranged downstream the first polyphase filter PF1 and a second adder 532 arranged downstream the second polyphase filter PF2. A radio signal IN is fed to the first input 510 of the first polyphase filter PF1 and to the first input 512 of the second polyphase filter PF2. The radio signal IN is filtered by the first polyphase filter PF1 and output as a first filtered radio signal at the output 511 of the first polyphase filter unit PF1. The radio signal IN is also filtered by the second polyphase filter PF2 and output as a second filtered radio signal at the output 513 of the second polyphase filter unit PF2. The first and the second filtered radio signal are then added at the adder 531 to obtain a filtered output radio signal OUT which is a lowpass signal and represents the output of the receive filter FU. Additionally the first filtered radio signal is inverted with respect to its sign and subtracted from the second filtered radio signal at the adder 532 to obtain a third filtered radio signal which is a highpass signal and represents the signals outside the frequency range of the lowpass signal. The third filtered radio signal is fed to a first measurement unit MEA3, which measures the strength of the third filtered radio signal and generates an highpass power signal HP which is fed to the first input 520 of the control unit CTRL. The filtered output radio signal OUT is additionally fed to a second measurement unit MEA4, which measures the strength of the filtered output radio signal OUT and generates an lowpass power signal LP which is fed to the second input 521 of the control unit CTRL. Depending on the highpass power signal HP and/or the lowpass power signal LP the control unit CTRL generates a control signal SW which is fed to second inputs 514 of the first polyphase filter PF1 and the second polyphase filter PF2.

In addition to the first polyphase filter PF1 and the second polyphase filter PF2 the radio receiver 500 may have one or more further polyphase filters. A decimation by a factor of n would, for instance, be possible with n total polyphase filters. The sum of the outputs of the polyphase filters PF1 and PF2 as output by the first adder 531 is the filtered output radio signal OUT which may be filtered for a predetermined central frequency. Frequencies outside a frequency range around the central frequency are suppressed in signal strength, so that the first adder 531 may be considered a lowpass filter unit. On the other hand, the difference between the outputs of the polyphase filters PF1 and PF2 as output by the second adder 532 is the third filtered radio signal which has a suppressed signal strength within a frequency range around the central frequency. In this context, the second adder 532 may be considered a highpass filter unit, because neighboring frequencies to the central frequency filtered by the polyphase filters PF1 and PF2 are filtered for.

The first measurement unit MEA3 and the second measurement unit MEA4 each may have a unit for determining the signal strength or signal power of an input signal, such as a unit for determining the root mean square of the amplitude of the input signal or a unit for determining the absolute value of the amplitude of the input signal. The first measurement unit MEA3 may generate a highpass power signal HP which is indicative of the signal strength of the third filtered radio signal. For instance, the highpass power signal HP may be indicative of the signal strength of the third filtered radio signal at frequencies neighboring the central frequency filtered for with the polyphase filters PF1 and PF2. The second measurement unit MEA4 may generate a lowpass power signal LP which is indicative of the signal strength of the filtered output radio signal OUT. For instance, the lowpass power signal LP may be indicative of the signal strength of the filtered output radio signal OUT at the central frequency filtered for with the polyphase filters PF1 and PF2.

The control unit CTRL may generate a control signal SW taking into account the lowpass power signal LP and the highpass power signal HP. If the highpass power signal HP is small compared to the lowpass power signal LP, this may indicate that the momentarily selected filtering quality of the polyphase filters PF1 and PF2 is sufficient, because signals at neighboring frequencies to the frequency filtered for are suppressed to a sufficient degree, thereby decreasing the overall signal strength of the radio signal after filtering. On the other hand, if the high pass power signal HP is high in comparison to the lowpass power signal LP, this may indicate that the momentarily selected filtering quality is not sufficient, because signals at neighboring frequencies to the frequency filtered for are not suppressed to a sufficient degree. In response to high pass power signal HP being high in comparison to the lowpass power signal LP, the control unit CTRL may generate the control signal SW to select a different filter quality that may be more appropriate to the current receiving characteristics. The selection of a different filter quality may be accomplished by changing the filtering characteristics of the first and the second polyphase filters PF1 and PF2 or may be accomplished by selecting which number k out of n polyphase filters included in the radio receiver 500 are to be included in the filtering path. When generating the control signal SW, taking into account the highpass power signal HP (which is indicative of the co-channel interference power) without taking into account the lowpass power signal LP is possible as well.

Figure 6:
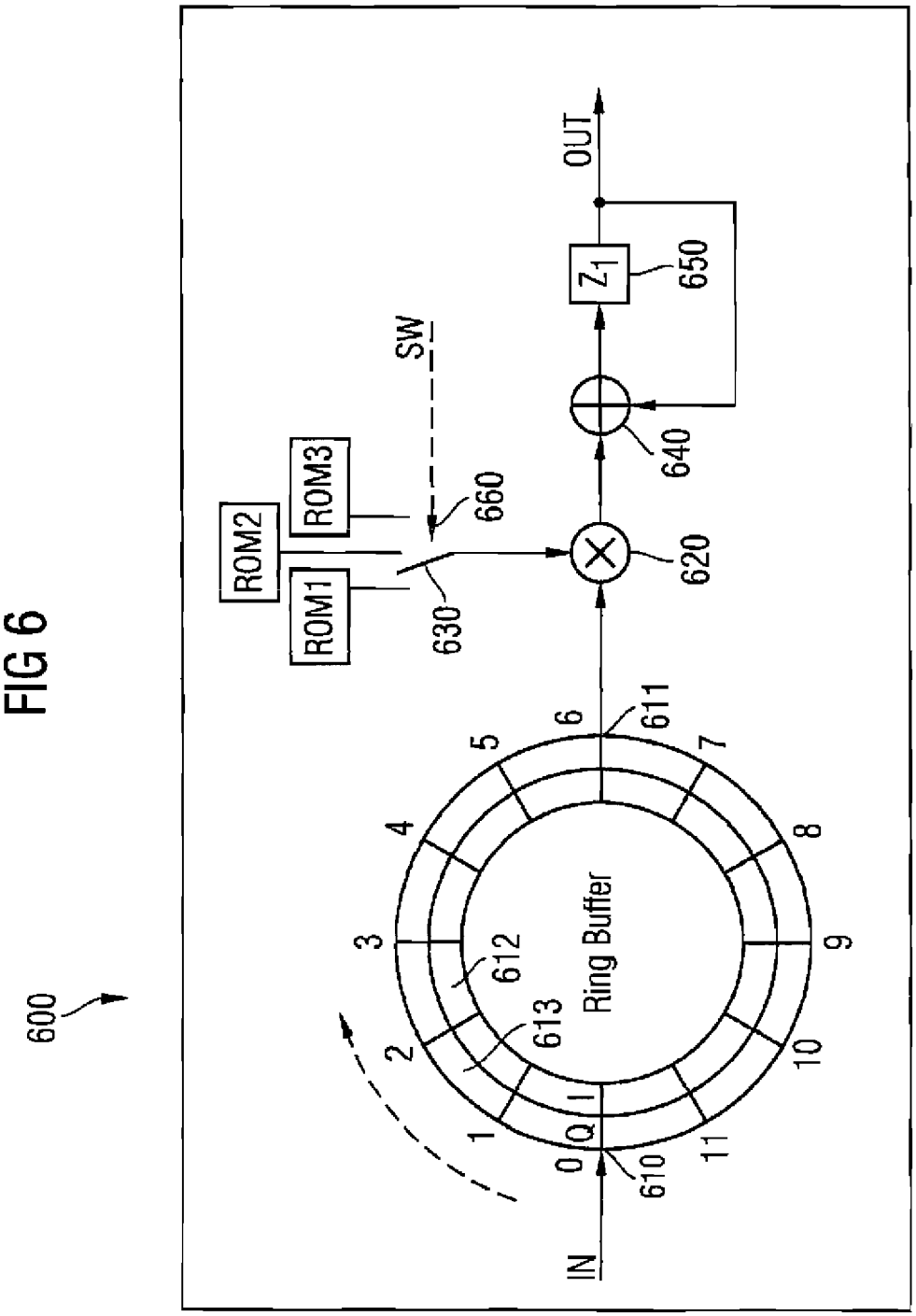
FIG. 6 is a schematic of an illustrative embodiment of an adjustable receive or transmit filter 600 of a radio receiver or radio transmitter.

FIG. 6 is a schematic of an illustrative embodiment of an adjustable receive or transmit filter 600 of a radio receiver or radio transmitter. The adjustable filter 600 includes a ring buffer with an input 610, an output 611, first buffer slots 612 and second buffer slots 613, a multiplier 620, a filter coefficient set selector 630, a plurality of read-only memory (ROM) storage tables ROM1, ROM2 and ROM3, an adder 640 and a delay unit 650. However, the storage tables may be embodied as other types of storage such as random-access memory (RAM) storage tables. A radio signal IN is fed to the input of the ring buffer, whereby the radio signal IN may be split into two orthogonal components, in particular I- and Q-components or polar coordinate components. The two components of the radio signal IN are fed to the first and the second buffer slots 612 and 613, respectively. In particular, the two components of the radio signal IN may be divided into data symbols, wherein each data symbol is fed to a slot of the ring buffer in sequence. Each component of a data symbol may be coded by one or more bits. The rate of the feeding of the data symbols to the slots of the ring buffer may be similar to a data symbol transmission/reception rate. At the output 611 of the ring buffer, the data symbols stored in the ring buffer are output to the multiplier 620 at a filter rate given by a clock signal with which the radio transmit/receive adjustable filter 600 is driven. A first data symbol may be output and multiplied at the multiplier 620 with a filter coefficient according to a set of filter coefficients stored in one of the storage tables ROM1, ROM2 or ROM3. The multiplied data symbol may then be fed to the adder 640, where it may be added to the data symbol previously having been multiplied with another filter coefficient at the multiplier 620. The sum of the previously multiplied data symbols may then be delayed by the delay unit 650 by one clock of the filter rate and fed back to the adder 640, where the next data symbol is added to the sum of the previously multiplied data symbols. At the delay unit 650 a filtered output radio signal OUT is output.

The radio transmit/receive adaptive filter 600 may further include a filter coefficient set selector 630 which may be configured to connect one of the storage tables ROM1, ROM2 and ROM3 to an input of the multiplier 620. Depending on the control signal SW, the filter coefficient set selector 630 may select one of the storage tables ROM1, ROM2 and ROM3 as the selected storage table. The number of storage tables is not limited to three as shown in FIG. 6, but may be increased to any number of ROM storage tables as appropriate to the desired filtering characteristics. Each storage table may have fixed sets of filter coefficients stored or may have sets of filter coefficients stored which may be programmable and/or dynamic. In particular, different sets of filter coefficients may include different numbers of filter coefficients that have a value unequal to zero. A set of filter coefficients with a small number of filter coefficients with values unequal to zero will in general be selected, if the filter quality of the selected filter is to be low. On the other hand, a set of filter coefficients with a high number of filter coefficients with values unequal to zero may in general be selected, if the filter quality of the selected filter is to be high. Thus, if all sets of filter coefficients have the same number of coefficients, sets with a large number of zeros correspond to a transmit/receive filter 600 adjusted to small quality and sets with a small number of zeros (or without zeros) correspond to a transmit/receive filter 600 adjusted to high quality.

The adaptive filter 600 is illustrated by way of example as an FIR filter. However, the ring buffer may also be part of an FIR filter path and may have any number of buffer slots as appropriate to the desired filter characteristics. The ring buffer, the multiplier 620, the adder 640 and the delay unit 650 may be configured to be in an inactive state for predetermined periods of time during the filtering of a signal depending on the selected set of filter coefficients, namely during multiplication of zeros.

The radio transmit/receive adaptive filter 600 may further have additional delay registers (not shown) configured to delay the filtered output radio signal for a predetermined amount of time. The delay registers may in particular be arranged to synchronize the group velocity of a filtered radio signal, depending on the selected set of filter coefficients. The selection of the set of filter coefficients may be made according to the general principles of filter selection as detailed for FIGS. 1 to 5.

Figure 7:
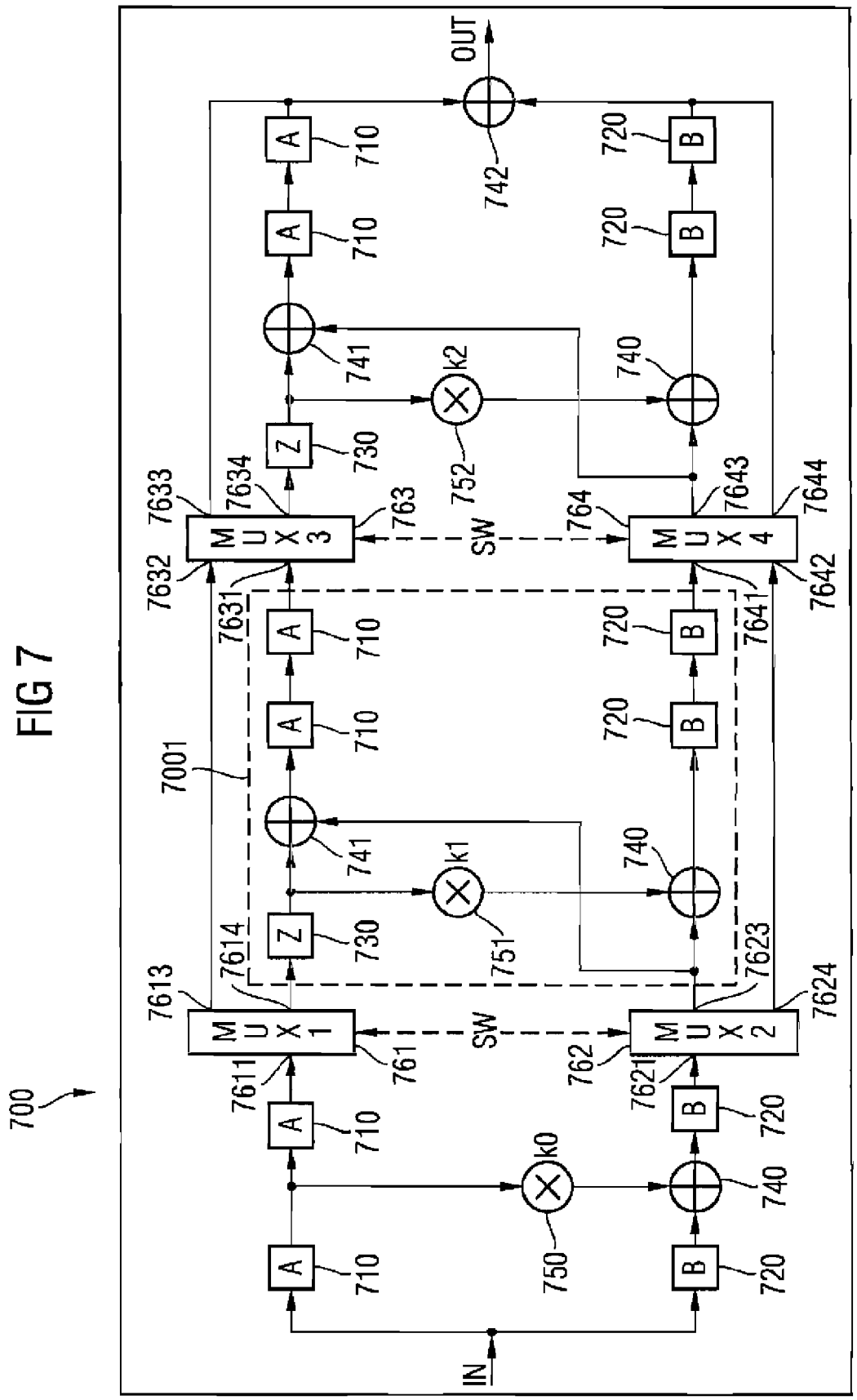
FIG. 7 is a schematic of another illustrative embodiment of an adjustable receive or transmit filter 700.

FIG. 7 is a schematic of an illustrative embodiment of an adaptive filter 700 of a radio transmitter/receiver. The adaptive filter 700 is a polyphase filter unit having multiple different filters. Additional components of the radio transmitter/receiver 700 may be similar to the respective ones described in context with the FIGS. 1 to 5. The polyphase filter unit includes a first signal path having a plurality of first polyphase units 710, a plurality of delay units 730, a plurality of first adders 741 and a plurality of first multiplexing units 761, 763 and a second signal path having a plurality of second polyphase units 720, a plurality of second adders 740 and a plurality of second multiplexing units 762, 764. The polyphase filter unit further has a plurality of first interconnection paths interconnecting the first signal path to the second signal path, the first interconnection paths including each a multiplier 750, 751, 752. The polyphase filter unit further has a plurality of second interconnection paths interconnecting the second signal path to the first signal path.

A radio signal IN is fed to the first signal path and to the second signal path. In the first signal path the radio signal IN is processed in a polyphase unit 710. Then the processed signal is fed to a further polyphase unit 710 and to a multiplier 750 in a first interconnection path, where the processed signal is multiplied with a normalization value k0. The signal processed twice is then fed to the input 7611 of a first multiplexing unit 761. In the second signal path the radio signal IN is processed in a polyphase unit 720 and then added at a second adder 740 to the signal output by the multiplier 750 of the first interconnection path. The added signal is then processed in a further polyphase unit 720 and output to the input 7621 of a second multiplier unit 762. A combination of the signals input to the inputs 7611 and 7621 would yield a radio signal which has been filtered by a polyphase filter of second order.

The multiplexing units 761 and 762 may be controlled by a control signal SW as detailed in context with FIGS. 1 to 5. Depending on the control signal SW, the signal fed to input 7611 may either be fed to a second input 7632 of a third multiplexing unit 763 or to a first signal path of a second polyphase filter stage 7001 indicated by the dotted line. Similarly the signal fed to input 7621 may either be fed to a second input 7642 of a fourth multiplexing unit 764 or to a second signal path of the second polyphase filter stage 7001. The polyphase filter stage 7001 is a second order polyphase filter unit. The first signal path of the polyphase filter stage 7001 may include a delay unit 730, an adder 741 and two polyphase units 710. The second signal path of the polyphase filter stage 7001 may include an adder 740 and two polyphase filter units 720. A radio signal input to the first signal path is first delayed by the delay unit 730 and then fed to the adder 741 and to a first interconnection path having a multiplier 751. The multiplier 751 multiplies the radio signal with a normalization value k1 and outputs the multiplied signal to an adder 740 of the second signal path. The adder 741 adds the signal from the delay unit 730 to a radio signal fed to the second signal path of the polyphase filter stage 7001 and feeds the output to a series of polyphase units 710, where the output signal from the adder 741 is processed twice and then output to a first input 7631 of the third multiplexing unit 763. The signal output from the multiplier 751 is added to the signal fed to the second signal path of the polyphase filter stage 7001 at the adder 740 and then fed to a series of polyphase units 720, where the output signal from the adder 740 is processed twice and then output to a first input 7641 of the fourth multiplexing unit 764.

Any number of polyphase filter stages similar to the polyphase filter stage 7001 may be coupled in an analog manner to the outputs of the third and fourth multiplexing units 763 and 764. The third and fourth multiplexing units 763 and 764 may be controlled by a control signal SW similar to the first and second multiplexing units 761 and 762, respectively. In the FIG. 7 only one further arrangement of a polyphase filter stage similar to the polyphase filter stage 7001 is shown downstream of the third and fourth multiplexing units 763 and 764. However, this embodiment is not limited to one polyphase filter stage as one skilled in the art may obviously note. By relaying a radio signal through one or more of the plurality of polyphase filter stages, while bypassing other polyphase filter stages by means of selectively controlling the multiplexing units, filters of different filtering orders, and hence filter qualities, may be realized.

After the last polyphase filter stage, the processed signal output from the first signal path and the processed signal output from the second signal path are added at the adder 742 and output as a filtered output radio signal OUT.

Figure 8:
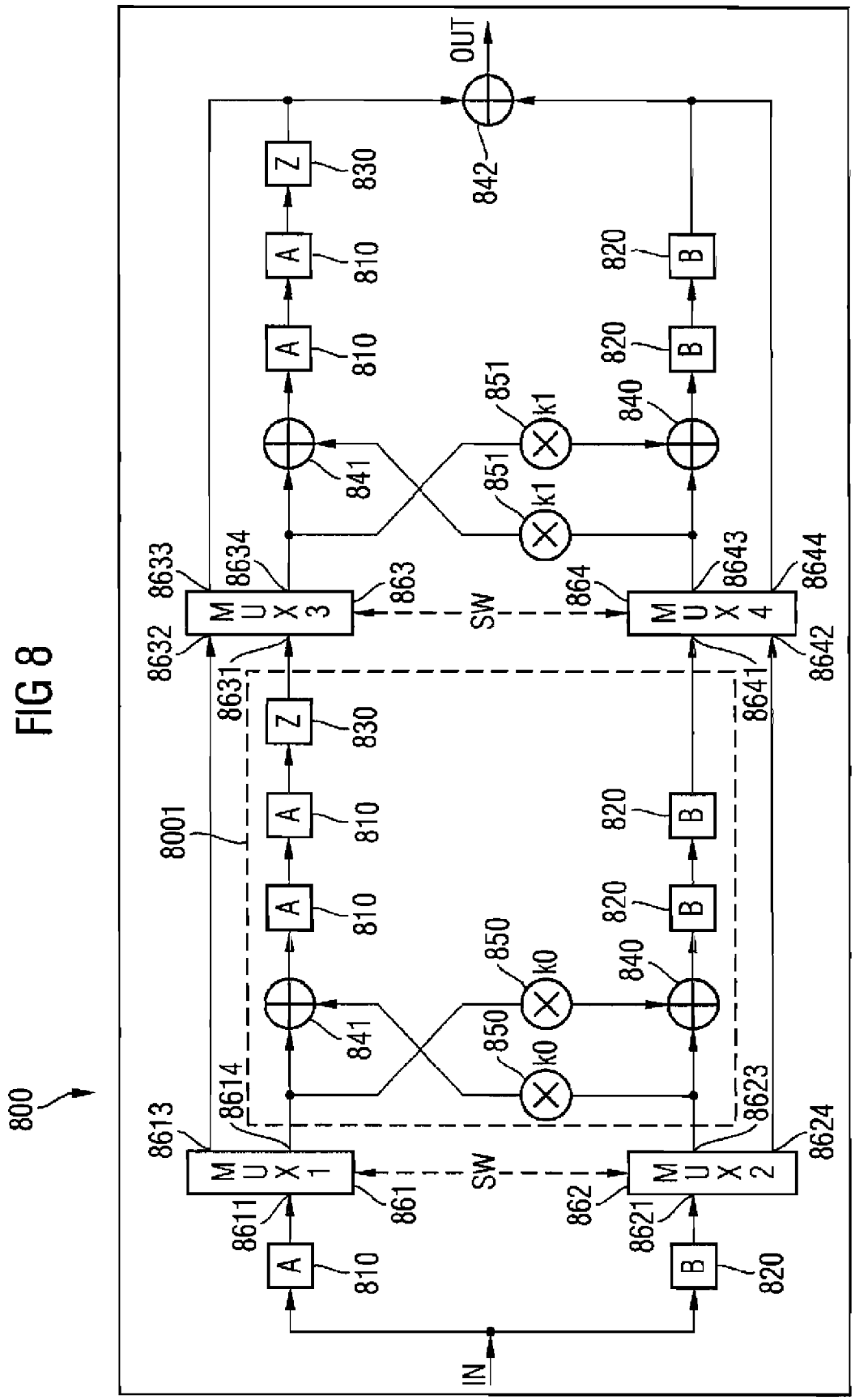
FIG. 8 is a schematic of another illustrative embodiment of an adjustable receive or transmit filter 800.

FIG. 8 is a schematic of another illustrative embodiment of an adaptive filter 800 of a radio transmitter/receiver. The adaptive filter 800 is a polyphase filter unit having multiple different filters. The polyphase filter unit may have a similar configuration as the polyphase filter unit in FIG. 7. Analogously to FIG. 7, a plurality of polyphase filter stages 8001 of second order are coupled to each other via multiplexing units 861, 862, 863 and 864. The difference to the polyphase filter unit in FIG. 7 is, that the first polyphase filter stage of the radio transmit/receive adjustable filter 800 includes a first signal path having a polyphase unit 810 and a second signal path having a polyphase unit 820. The first polyphase filter stage is of first order. Additionally, the second interconnection paths connecting between the second signal path and the first signal paths of the subsequent polyphase filter stages include multipliers 850 which are similar to the multipliers 850 included in the first interconnection paths connecting between the first signal path and the second signal paths of the subsequent polyphase filter stages. The polyphase filter unit of the radio transmit/receive adjustable filter 700 in FIG. 7 thus may allow only for selection of polyphase filters of even-numbered order, while the polyphase filter unit of the radio transmit/receive adjustable filter 800 in FIG. 8 may allow only for selection of polyphase filters of odd-numbered order.

Figure 9:
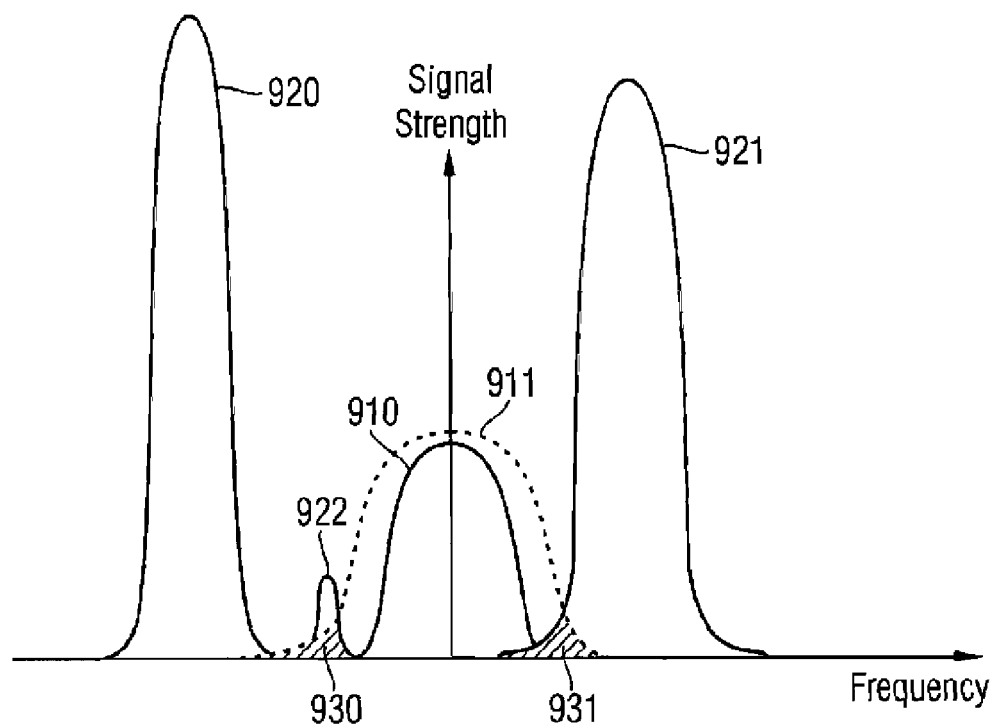
FIG. 9 is a graphical representation of illustrative radio signals.

FIG. 9 shows a graphical representation of an illustrative radio signal as a plot of signal strength versus frequency. A radio signal as received by radio receivers detailed in context with FIGS. 2, 4, 5, 6, 7 and 8 may include several signal components at different frequencies. The radio signal shown in FIG. 9 includes different signal components 910, 920, 921 and 922 each having a different signal strength. Each of the signal components has a different center frequency and a distribution of signal strength within a range around the center frequency, so that within a certain distance from the center frequency of a signal component the contribution to the overall signal strength may be considered negligible.

Suppose a radio receiver according to one of the previously mentioned embodiments has a filter unit filtering for the center frequency of the signal component 910. Then the filter unit has a spectral filtering mask indicated by the dotted line 911, which means that signals at the center frequency may pass in maximum strength, while signals at frequencies neighboring the center frequency are suppressed to a certain extent depending on the distance of the neighboring frequency to the center frequency filtered for. The signal component 910 will therefore contribute most of the signal strength to the overall signal strength of the filtered radio signal. Signal component 920 has a center frequency which is spectrally further away from the center frequency of the signal component 910 than the center frequencies of the signal components 921 and 922. Given the spectral filtering mask 911, the signal component 920 will therefore contribute to a negligible extent to the overall signal strength of the filtered radio signal. Thus, the signal component 920 may be said to be filtered out of the radio signal by the spectral filtering mask 911.

However, signal components 922 and 921 may contribute to the overall signal strength of the filtered radio signal to a notable degree. This can be seen from the overlap 930 of the signal component 922 and the overlap 931 of the signal component 921 with the spectral filtering mask 911. The radio signal intended for by filtering with the spectral filtering mask 911 will therefore contain signal components not intended for, deteriorating the overall signal quality. By applying a different filter to the radio signal in FIG. 9, the spectral filtering mask may be arranged to have a higher quality (e.g. narrower spectral shape and/or steeper flanks), thus more effectively suppressing signal components neighboring the center frequency filtered for.

Suppose now that the radio signal in FIG. 9 would only consist of signal components 910 and 920. Then the spectral filtering mask 911 would be sufficient or could even still be of less quality (e.g. broader and/or with less steeper flanks) for effectively suppress the signal component 920 not intended for by filtering. The selection of different filters may therefore select a filter according to the signal strength of radio signal components neighboring the center frequency of the signal component filtered for and may even take into account the reception characteristics of the intended radio signal filtered for. Thus, filters of different quality, e.g., of different filter path length or different filter order, may be used to suppress frequencies outside a specified frequency range more or less effectively.

The invention claimed is:

1. An apparatus, comprising:
    a filter unit comprising a plurality of different filters each configured to, when selected, filter a first signal by suppressing frequencies that are outside a frequency range, the frequency range being centered around a center frequency of the first signal; and
    a control unit configured to select one of the plurality of filters depending on a strength of the first signal before the first signal is filtered by the filter unit and a strength of a second signal output from a previously selected one of the plurality of filters, and such that the one of the plurality of filters is selected responsive to a ratio of the strength of the first signal and the strength of the second signal at least reaching a predetermined threshold.

2. The apparatus of claim 1, wherein the plurality of filters are each a digital filter.

3. The apparatus of claim 1, wherein the plurality of filters are of different qualities.

4. The apparatus of claim 1, wherein the filter unit comprises:
    a plurality of different filter paths each corresponding to one of the plurality of filters; and
    a filter path selector configured to select one of the filter paths in response to a control signal output from the control unit.

5. The apparatus of claim 4, wherein the plurality of filter paths comprise a plurality of polyphase filters.

6. The apparatus of claim 1, further comprising a delay unit configured to delay the first signal by a predetermined period of time responsive to a change of the selected filter.

7. The apparatus of claim 1, wherein the control unit comprises an input configured to receive a third signal representative of the strength of the first signal.

8. The apparatus of claim 1, wherein the apparatus is part of a mobile phone.

9. The apparatus of claim 1, wherein the control unit is configured to select the one of the plurality of filters responsive to the ratio falling below the predetermined threshold.

10. The apparatus of claim 1, wherein the strength of the first signal is indicative of a signal strength at all frequencies comprised in the first signal, and the strength of the second signal is indicative of a signal strength at all frequencies comprised in the second signal.

11. An apparatus, comprising:
    a filter unit comprising a plurality of different filters each configured to filter a first signal when selected such that a first frequency of the first signal is passed and a second frequency of the first signal is suppressed relative to the first frequency of the first signal, the filter unit further being configured to generate a second signal; and
    a control unit configured to select one of the plurality of filters depending upon a strength of the first signal before the first signal is filtered by the filter unit at the second frequency and a strength of the second signal, and such that the one of the plurality of filters is selected responsive to a ratio of the strength of the first signal and the strength of the second signal at least reaching a predetermined threshold.

12. The apparatus of claim 11, wherein the plurality of filters are each a digital filter.

13. The apparatus of claim 11, wherein the plurality of filters are of different qualities.

14. The apparatus of claim 11, wherein the filter unit comprises:
    a plurality of different filter paths each corresponding to one of the filters; and
    a filter path selector configured to select one of the filter paths in response to a control signal output from the control unit.

15. The apparatus of claim 11, wherein the filter paths comprise a plurality of polyphase filters.

16. The apparatus of claim 15, further comprising a combiner configured to combine outputs of the polyphase filters, and to generate a third signal representative of the strength of the first signal at the second frequency.

17. The apparatus of claim 11, further comprising a delay unit configured to delay the first signal by a predetermined period of time responsive to a change of the selected filter.

18. The apparatus of claim 11, further comprising a measurement unit configured to measure the strength of the first signal and the strength of a second signal.

19. A method, comprising:
    selecting a filter from a plurality of filters depending upon a strength of a first signal before the first signal is filtered by the selected filter and a strength of a second signal output from a previously selected one of the plurality of filters, wherein said selecting is performed responsive to a ratio of the strength of the first signal and the strength of the second signal at least reaching a predetermined threshold; and
    filtering the first signal with the selected filter so as to suppress frequencies outside a frequency range, wherein the frequency range is centered around a center frequency of the first signal.

20. The method of claim 19, wherein the first signal is a mobile radio signal.

21. The method of claim 19, further comprising delaying, responsive to a change of the selected filter, the first signal by a predetermined period of time.

22. A method, comprising:
    determining a signal strength of a first signal at frequencies outside a predetermined frequency range;
    determining a signal strength of a second signal output from one of a plurality of filters;
    selecting, responsive to a ratio of the signal strength of the first signal and the signal strength of the second signal at least reaching a predetermined threshold, a filter from the plurality of filters depending upon the signal strength of the first signal at the frequencies outside the predetermined frequency range and the signal strength of the second signal; and
    filtering the first signal with the selected filter.

23. The method of claim 22, wherein the first signal is a mobile radio signal.

24. The method of claim 22, further comprising:
    generating a third signal representative of the signal strength of the first signal at the frequencies outside the predetermined frequency range; and
    generating a fourth signal representative of the signal strength of the first signal at frequencies within the predetermined frequency range.

25. An apparatus, comprising:
a filter unit comprising a plurality of different filters each configured to provide, when a respective filter is selected, a different stopband attenuation that is centered around a center frequency of a first signal, the filter unit further being configured to filter the first signal using the selected one of the filters; and
a control unit configured to select one of the plurality of filters depending on a strength of the first signal received by the filter unit and a strength of a second signal output from a previously selected one of the plurality of filters, and such that the one of the plurality of filters is selected responsive to a ratio of the strength of the first signal and the strength of the second signal at least reaching a predetermined threshold.

* * * * *